United States Patent [19]

Finger

[11] 4,288,734
[45] Sep. 8, 1981

[54] BIDIRECTIONAL INTEGRATOR

[75] Inventor: Eugene P. Finger, Brewster, N.Y.

[73] Assignee: Curtis Instruments, Inc., Mount Kisco, N.Y.

[21] Appl. No.: 42,532

[22] Filed: May 25, 1979

[51] Int. Cl.³ .................... H02J 7/00; G01R 11/00
[52] U.S. Cl. ................... 320/48; 324/76 A; 324/428; 364/733; 320/44
[58] Field of Search .................. 320/48, 44, 45; 324/428, 76 A; 340/636; 364/481, 605, 733

[56] References Cited

U.S. PATENT DOCUMENTS

| | | | |
|---|---|---|---|
| 3,835,362 | 9/1974 | Greene | 320/48 X |
| 3,895,284 | 7/1975 | Schweizer et al. | 320/48 |
| 3,898,548 | 8/1975 | Perelle et al. | |
| 3,906,329 | 9/1975 | Bader | 320/48 X |
| 4,017,724 | 4/1977 | Finger | 320/48 X |
| 4,114,083 | 9/1978 | Benham et al. | 320/48 X |
| 4,153,867 | 5/1979 | Jungfer et al. | 320/48 X |
| 4,181,885 | 1/1980 | Gosser et al. | 320/48 X |
| 4,194,146 | 3/1980 | Patry et al. | 320/48 X |

Primary Examiner—Robert J. Hickey
Attorney, Agent, or Firm—Pennie & Edmonds

[57] ABSTRACT

A bidirectional integrator is described comprising first and second programmable pulse-forming channels (20, 40), a bidirectional counter (60) and an output display (78). Each pulse forming channel provides means for making both continuous and discrete adjustments in the repetition rate of the pulses formed thereby. In the preferred embodiment, each pulse forming channel comprises an integrator (26, 46) for forming a pulsed output signal, means (24, 44) for varying the pulse repetition rate of the output signal by varying the input signal to the integrator, and a programmable digital divider circuit (30, 50) for dividing the repetition rate of the output signal by any power of two from one to 4096.

9 Claims, 1 Drawing Figure

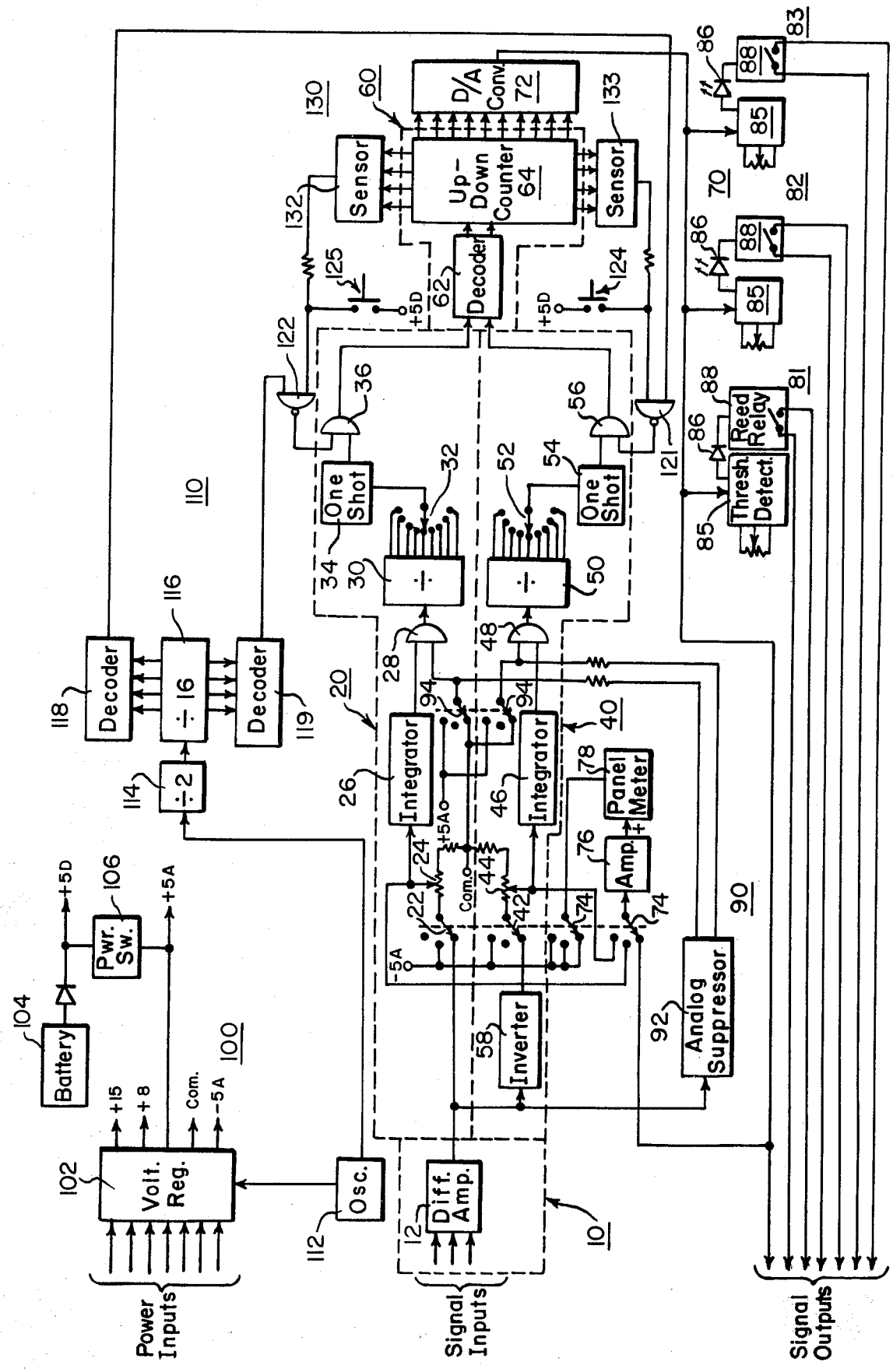

BIDIRECTIONAL INTEGRATOR

TECHNICAL FIELD

The present invention relates to field programmable bidirectional integrators which are especially useful as battery state-of-charge indicators. For convenience, the use of such integrators will be described in terms of their application as battery state-of-charge indicators, but it will be recognized that such integrators may be used in many other applications.

BACKGROUND OF THE INVENTION

Bidirectional battery state-of-charge indicators operate in two directions corresponding to the charging and discharging phases of a battery. Such indicators range in construction complexity from devices having simple "end of discharge" and "end of charge" signals to more complex devices producing continuous and discrete signals suitable for charge control, discharge control and state-of-charge display.

It is well known that the total discharge current available from a battery is a function of its use and is usually less than that required to charge it fully. As a result, state-of-charge indicators sometimes have different integration constants for the charge and discharge cycles. For example, Perelle et al. in U.S. Pat. No. 3,898,548 describe a state-of-charge indicator in which signals representative of the charging current and the discharging current are systematically weighted so that the output of the indicator reflects the state-of-charge remaining in the battery. The Perelle et al. device, however, is relatively complicated and permits only a limited range of adjustments for the differences in the charging and discharging cycles of a battery.

A further difficulty with conventional battery state-of-charge indicators is their limited interchangeability among systems having different operating voltages and/or different energy capacities. For example, to use a conventional battery state-of-charge indicator to monitor batteries having substantially different terminal voltages it typically is necessary to use different indicators. Likewise, because storage batteries have widely different electrical capacities, it frequently is necessary to provide state-of-charge indicators having widely different display ranges. While different display ranges can be built into a single display, such prior art displays typically have been relatively complicated.

SUMMARY OF THE INVENTION

In order to provide a relatively simple bidirectional integrator which is useful in indicating battery state-of-charge, I have devised a field programmable bidirectional integrator. My integrator comprises first and second programmable pulse-forming channels, a bidirectional counter and an output display. Each pulse forming channel provides means for making both continuous and discrete adjustments in the repetition rate of the pulses formed thereby. In the preferred embodiment of my invention, each pulse forming channel comprises an integrator for forming a pulsed output signal, means for varying the pulse repetition rate of the output signal by varying the input signal to the integrator, and a programmable digital divider circuit for dividing the repetition rate of the output signal by any power of two from one to 4096.

When my bidirectional integrator is used to monitor battery state-of-charge, one of these channels is connected to the bidirectional counter to integrate the charging current; and the other channel is connected to the bidirectional counter to integrate the discharging current. Appropriate divisors are then selected for the digital divider circuits in the two channels so that the display range of the output display is calibrated to the battery capacity. The pulse output rates of the integrators in the two channels are then adjusted so that the count registered by the bidirectional counter is the same when charging the battery as it is when discharging the battery. If necessary, this adjustment may also involve an adjustment of the divisors in the digital divider circuits.

BRIEF DESCRIPTION OF THE DRAWING

These and other objects, features and elements of my invention will become apparent in connection with the following detailed description and accompanying drawing of a preferred embodiment of my invention.

DETAILED DESCRIPTION OF THE INVENTION

As shown in the accompanying drawing, the bidirectional integrator of my invention comprises an input means 10, first and second programmable pulseforming channels 20, 40, a bidirectional counter 60 and output means 70. The apparatus further comprises a control circuit 90, a power supply 100, resetting means 110 and limiting means 130.

Preferably, input means 10 is a differential amplifier 12 having a gain of $-50$. Illustratively, the input to this amplifier is derived from a current shunt connected in known fashion in the circuit between a battery and a load. The output of amplifier 12 is applied to both the first and second programmable pulse-forming channels 20, 40 as well as to control circuit 90.

Pulse-forming channels 20 and 40 are substantially the same. Channel 20 comprises a switch 22, a potentiometer 24, a self-resetting precision integrator 26, an AND gate 28, a digital divider circuit 30, a selector switch 32, a one-shot 34, and an AND gate 36. The same elements are found in the second pulse-forming channel 40 and bear the same numbers incremented by 20. In addition, the second pulse-forming channel also includes an inverter 58.

Potentiometers 24, 44 are elements in voltagedivider networks in their respective channels which permit one to vary the input voltage to integrators 26, 46 independently and continuously over a factor of two. Integrators 26, 46 are self resetting integrators which operate between precise limits. Everytime a first limit is reached, a single output pulse is produced which is applied to one input of AND gates 28 or 48; and the integrator is reset to the second limit. The rate at which the output pulses are produced is directly proportional to the input voltage applied to the integrators. Hence, the setting of potentiometers 24, 44 determines the output pulse repetition rate of integrators 26, 46, respectively. In practicing my invention I have typically used integrators for which the maximum output pulse repetition rate can be varied continuously from about 40 to about 80 pulses per second.

Digital divider circuits 30, 50 divide the input pulses by any power of two from one to 4096. The particular divisor used is selected by selector switches 32, 52 which connect one output terminal from divider circuits 30, 50 to the input terminal of one-shots 34, 54.

One-shots 34, 54 produce a single negative pulse for each pulse received from divider circuits 30, 50.

Bidirectional counter 60 comprises an up-down counter 64 and a decoder 62 connected to AND gates 36, 56. Illustratively, a pulse output from AND gate 36 sets decoder 62 in the "up" state and causes it to increment counter 64 by one. Conversely, a pulse output from AND gate 56 sets decoder 62 in the "down" state and causes it to decrement counter 64 by one.

Output means 70 comprises a digital-to-analog converter 72 connected to counter 64, a switch 74, an isolating buffer amplifier 76 and a panel meter 78. These elements provide an analog display of the digital count stored in counter 64. Output means 70 further comprises three warning circuits 81, 82 and 83 connected to converter 72, each of which comprises a threshold detector 85, a light-emitting diode 86 and a reed relay 88. Each of these circuits can be used to operate a light and/or a switch when the count in counter 64 exceeds or falls below a threshold level which can be set by adjustment of the appropriate threshold detector 85.

Advantageously, switches 22, 42 and 74 are ganged together and wired so that buffer amplifier 76 and panel meter 78 can also be connected selectively to potentiometers 24, 44. When so connected, the panel meter in essence displays the potentiometer arm position thereby facilitating the adjustment of the output pulse frequencies from integrators 26, 46.

Control circuit 90 controls AND gates 28 and 48 in the first and second pulse-forming channels. The circuit comprises an analog suppressor 92 and a switch 94. The suppressor functions so that only one of AND gates 28 and 48 is enabled at any one time and no gate is enabled unless the magnitude of the input signal applied to control circuit 90 exceeds a predetermined level. Thus, control circuit 90 determines which one of channels 20, 40 produces output pulses and thereby controls the direction in which bidirectional counter 60 is driven. Illustratively, when channel 20 monitors charging current and channel 40 monitors discharging current, AND gate 28 is enabled when the signal input to control circuit 90 exceeds +1 millivolt, and AND gate 48 is enabled when the signal input to control circuit 90 is less than −1 millivolt. When the input signal is between −1 millivolt and +1 millivolt, neither gate is enabled.

Power supply 100 comprises a voltage regulator 102, a memory battery 104 and a power switch 106. The voltage regulator is a conventional device which provides the necessary regulated voltages for operation of the bidirectional integrator. Typically, power is provided to the power supply from the battery whose state-of-charge is monitored by the bidirectional integrator. The memory battery supplies a sufficient signal to preserve the contents of up-down counter 64 in situations where power supply 100 is cut off.

Resetting means 110 comprises an oscillator 112, A divide-by-two circuit 114, a divide-by-sixteen circuit 116, first and second decoders 118 and 119, NAND gates 121, 122, and switches 124, 125. Illustratively, oscillator 112 is a 3.2 KHz oscillator with the result that the output signal from decoders 118 and 119 is a 100 Hz signal. Advantageously, decoders 118 and 119 are selected so that their output signals are out of phase. Switches 124, 125 permit NAND gates 121, 122, respectively, to be enabled to pass the 100 Hz signal to AND gates 56, 36, respectively. Thus, when switch 124 is closed, a 100 Hz signal rapidly decrements counter 64; and when switch 125 is closed a 100 Hz signal increments counter 64.

Finally, limiting means 130 comprises sensors 132, 133, the first of which senses when counter 64 reaches its minimum value and the second of which senses when counter 64 reaches its maximum value. When a minimum value is sensed, sensor 132 enables NAND gate 122 to pass the 100 Hz signal to AND gate 36. As a result encoder 62 increments counter 64. Since the count stored in counter 64 is no longer the minimum value, sensor 132 detects this and disables NAND gate 122. Sensor 133 controls NAND gate 121 in similar fashion when a maximum value is sensed in counter 64. I have found that such use of limiting means 130 is superior to a simple inhibiting function because it makes up-down counter 64 immune to noise signals at the maximum and minimum values. Moreover, it assures that if the value present in up-down counter 64 when power is initially supplied to the bidirectional integrator is outside the range defined by the minimum and maximum values the value would be rapidly changed to one within such range.

To use my bidirectional integrator to monitor battery state of charge, the inputs to differential amplifier 12 are connected to a current shunt. Selector switches 32 and 52 are used to select appropriate divisors such that the full range of panel meter 78 is utilized in the course of a discharge of the battery from a fully charged to a depleted state. The pulse output rates of potentiometers 24, 44 are then adjusted so that the count registered by the bidirectional counter during the charging cycle is the same as that registered during the discharging cycle. The approximate settings for selector switches 32, 52 and potentiometers 24, 44 will be the same for the same type of batteries of the same size. Final adjustments of potentiometers 24, 44 will depend on the precision that is required. Such adjustments can be facilitated by selectively connecting the potentiometers to panel meter 78 and observing the display of potentiometer arm position.

Once these adjustments are completed, the bidirectional integrator is ready to be used to monitor battery state-of-charge. As the state-of-charge of the battery reaches certain levels, warning lights and signals are generated by circuits 81, 82, 83 which can be used both to alert the individual using the battery and to perform specific functions such as changing the load on the battery. The state-of-charge of the battery is constantly displayed on panel meter 78 and limiting means 130 keeps the meter from being driven off-scale.

As emphasized above, the repetition rate of the pulses formed by each channel 20, 40 is subject to two adjustments, $k_1$ and $k_2$, one of which factors is selected from a continuous range of factors and the other of which is selected from a set of discrete factors. Preferably, as in the embodiment described above, these two adjustments are combined multiplicatively so that the signal applied to bidirectional counter 60 is a function of the product of the input signal, $k_1$, and $k_2$. Advantageously, the range of continuous adjustments is at least as great as the ratio between successive discrete adjustments so that the combined effect of the continuous and discrete adjustments provides for continuous adjustement over the entire operating range of the bidirectional integrator. Thus, to provide for continuous adjustment of the output signal parameter over the 4096-to-one operating range of the preferred embodiment of my invention, a two-to-one continuous adjustment is required since discrete adjustments are made as powers of two. If, for example, the discrete adjustments were made as powers of four, it would be necessary to provide for a four-to-one range of continuous adjustment in order to provide for continuous adjustment throughout the operating range of the device.

As will be apparent, my invention may be practiced using many modifications which are included within the spirit and scope of the invention. Other methods than potentiometer control of the input signal to the integrator are available for performing the continuous adjustment. For example, instead of modifying the signal to be integrated before it is applied to integrators 26, 46 as the input signal, it is possible to vary the output signal pulse repetition rate by modifying the time constant of integration of said integrators. While a discrete adjustment range of 4096-to-one is preferred in order to make the bidirectional integrator useful in a wide range of circumstances, my invention may be practiced using divider circuits with a considerably smaller number of divisors. Moreover, in some applications it may also prove desirable to provide circuits for multiplication instead of, or in addition to, division of the pulse repetition rate.

The various output means 70, control circuit 90, resetting means 110 and limiting means 130 that are described are likewise only illustrative; and various alternatives will be apparent to those skilled in the art.

What is claimed is:

1. A bidirectional integrator for integrating an electrical signal comprising:

first and second programmable pulse forming channels, each channel comprising means for forming a pulsed output signal having a pulse repetition rate which is a function of an input signal to said signal forming means, means for modifying said pulse repetition rate by a first factor selected from a continuous range of factors and a programmable circuit for multiplying and/or dividing said pulse repetition rate by a second factor selected from a plurality of discrete factors;

a bidirectional counter which is driven in one direction by the pulsed output signal from the programmable circuit of the first channel and in the opposite direction by the pulsed output signal from the programmable circuit of the second channel;

means for controlling the direction in which said bidirectional counter is driven; and means for producing an output signal from said bidirectional counter.

2. The bidirectional integrator of claim 1 wherein said means for producing an output signal further comprises dipslay means for displaying the state of said bidirectional counter.

3. The bidirectional integrator of claim 2 wherein said modifying means comprises a variable resistance and said integrator further comprises means for selectively connecting said modifying means to said display means, whereby the value of the variable resistance in said modifying means may be displayed.

4. The bidirectional integrator of claim 1 wherein each signal forming means comprises an integrator.

5. The bidirectional integrator of claim 1 wherein said modifying means comprises a variable resistance to which is applied said electrical signal before it is applied as an input signal to said output signal forming means, said variable resistance determining said first factor.

6. The bidirectional integrator of claim 1 wherein the ratio of the maximum to the minimum of the continuous range of factors is approximately as great as the ratio between successive factors that may be selected from said plurality of discrete factors.

7. The bidirectional integrator of claim 1 wherein said controlling means further comprises means for controlling the signal applied to said programmable circuits so that no signal is applied to said programmable circuits unless the magnitude of said electrical signal exceeds a pre-determined level and a signal is applied to only one programmable circuit at a time depending on the polarity of said electrical signal.

8. The bidirectional integrator of claim 1 further comprising means for sensing when the bidirectional counter has reached a pre-determined maximum or minimum count and for preventing said counter from exceeding said maximum or minimum.

9. The bidirectional integrator of any one of claims 1–8 wherein said pulse repetition rate is a function of the product of the signal to be integrated, said first factor, and said second factor.

* * * * *